United States Patent [19]

Iwashita

[11] Patent Number: 4,846,719

[45] Date of Patent: Jul. 11, 1989

[54] PLURAL CONTACT PIN JACK ADAPTED TO RECEIVE ANY OF A PLURALITY OF DIFFERENT TYPES OF PLUGS

[75] Inventor: Masanori Iwashita, Ikoma, Japan

[73] Assignee: Hosiden Electronics Co., Ltd., Osaka, Japan

[21] Appl. No.: 168,051

[22] Filed: Mar. 14, 1988

[30] Foreign Application Priority Data

Mar. 18, 1987 [JP] Japan ............................ 62-40606[U]

[51] Int. Cl.[4] ............................................... H05K 1/00

[52] U.S. Cl. ...................................... 439/63; 439/668; 350/96.2

[58] Field of Search ........................... 350/96.2, 96.21; 439/63, 76, 78, 676, 668, 669

[56] References Cited

U.S. PATENT DOCUMENTS

| | | | |
|---|---|---|---|
| 2,470,915 | 5/1949 | Bosh | 439/669 X |
| 4,165,147 | 8/1979 | Buck | 439/668 X |
| 4,364,625 | 12/1982 | Baker et al. | 439/669 X |

*Primary Examiner*—Frank Gonzalez
*Assistant Examiner*—John Ngo
*Attorney, Agent, or Firm*—Pollock, Vande Sande and Priddy

[57] ABSTRACT

A pin jack fabricated of an insulating material defines therein an elongated hole for receiving a pin contact of a mating pin plug, the hole having a forward portion of a large inner diameter near the open end of the pin jack and a rear portion of the smaller inner diameter. First and second contacts are disposed in the large-diametered portion and a third contact is disposed in the smaller-diametered portion.

14 Claims, 6 Drawing Sheets

PLURAL CONTACT PIN JACK ADAPTED TO RECEIVE ANY OF A PLURALITY OF DIFFERENT TYPES OF PLUGS

BACKGROUND OF THE INVENTION

The present invention relates to a pin jack which is used in combination with a pin plug and, more particularly, to a pin jack which has a plurality of contacts.

Occasionally the situation arises where it would be desirable to transmit a digital signal as an optical signal because it is less sensitive to noise and does not generate noise. For such an optical transmission there has been proposed an optical connector of the type comprising, in combination, a pin plug in which an optical fiber is disposed along the axis of a center contact and a pin jack in which an optoelectro transducer for receiving an optical signal from the center optical fiber or an electrooptic transducer for applying light to the optical fiber are disposed opposite the end face of the optical fiber. With such an optical connector, however, an optoelectro or electrooptic transducer is needed for each jack which is mounted on equipment for external connection; this inevitably increases the cost of the jack. If the optoelectro or electrooptic transducer can be provided in the pin plug, then the total number of such transducers used for each equipment can be reduced when all jacks are not used with optical pin plugs.

SUMMARY OF THE INVENTION

It is therefore an object of the present invention to provide a pin jack which is free from the above-mentioned disadvantage of the prior art.

According to the present invention, a pin jack body of an insulating material defines therein an elongated hole for receiving a pin contact of the mating pin plug, the hole having a large-diametered forward portion and a small-diametered rear portion. The interior surface of the large-diametered portion has circumferentially extending first and second contact receiving grooves disposed side by side in the axial direction of the hole. First and second contacts are received in the first and second grooves, respectively, and held in the pin jack body. The first and second contacts partly protrude from the interior surface of the large-diametered portion but not higher than the interior surface of the small-diametered portion. A third contact extends in the small-diametered portion and is held in the pin jack body. The pin jack body is covered with a metallic cover.

In this way, the pin jack is formed as an electric connector, and accordingly the optoelectro or electrooptic transducer needs only to be provided in the mating pin plug.

DESCRIPTION OF THE PREFERRED EMBODIMENTS

Figure 1:
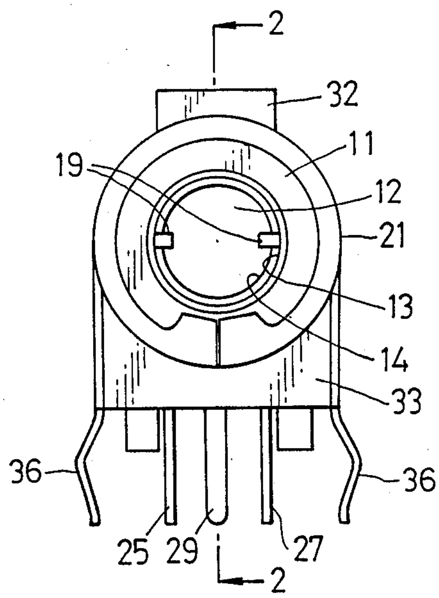
FIG. 1 is a front view illustrating an example of the pin jack of the present invention.
Figure 2:
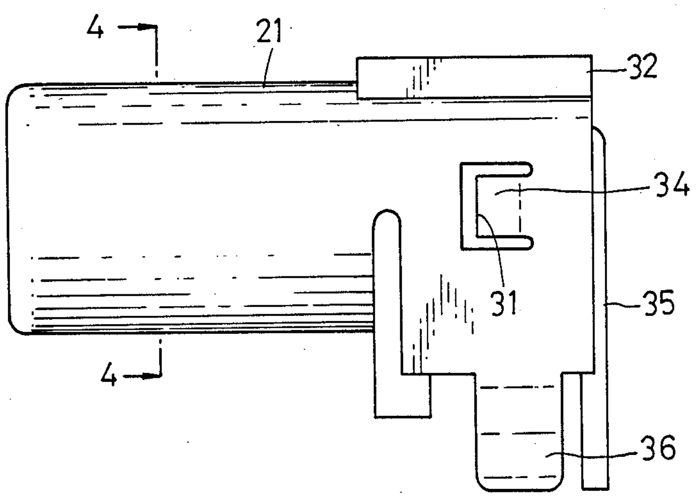
FIG. 2 is its right-hand side of the pin jack view.
Figure 3:
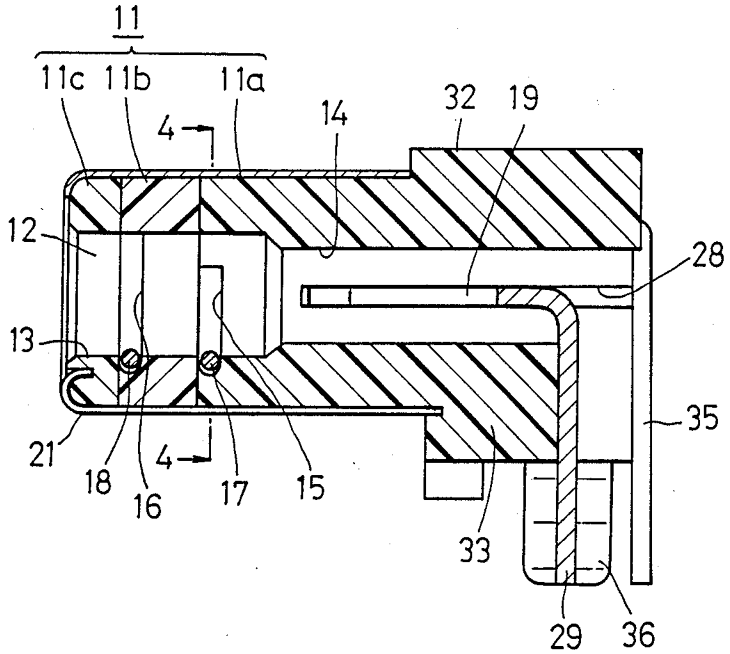
FIG. 3 is a sectional view taken on line 2—2 of FIG. 1.
Figure 4:
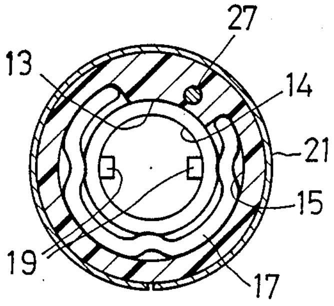
FIG. 4 is a sectional view taken on line 4—4 of FIG. 2.

Referring first to FIGS. 1 through 5, an embodiment of the pin jack of the present invention will be described. As shown in FIGS. 1 and 3, a pin jack body 11 made of an insulating material has an elongated hole 12 therein which is open at the front end of the pin jack body for receiving a pin contact of the mating pin plug. The hole 12 has a large-diametered forward portion 13 and a small-diametered rear portion 14 whose inner diameter is smaller than that of the large-diametered portion 13.

The large-diametered portion 13 has first and second circumferentially extending contact receiving grooves 15 and 16 cut side by side in its interior surface. First and second contacts 17 and 18 are received in the first and second groove 15 and 16, respectively. The first and second contacts 17 and 18 slightly protrude from the inner surface of the large-diametered portion 13 but not so high as to reach the height of the interior surface of the small-diametered portion 14, as exemplified in FIG. 4 which shows in section the first contact receiving groove 15. A third contact 19 is held in the pin jack body 11 protrusively from the interior surface of the small-diametered portion 14. The pin jack body 11 is covered with a metallic cover 21.

Figure 5:
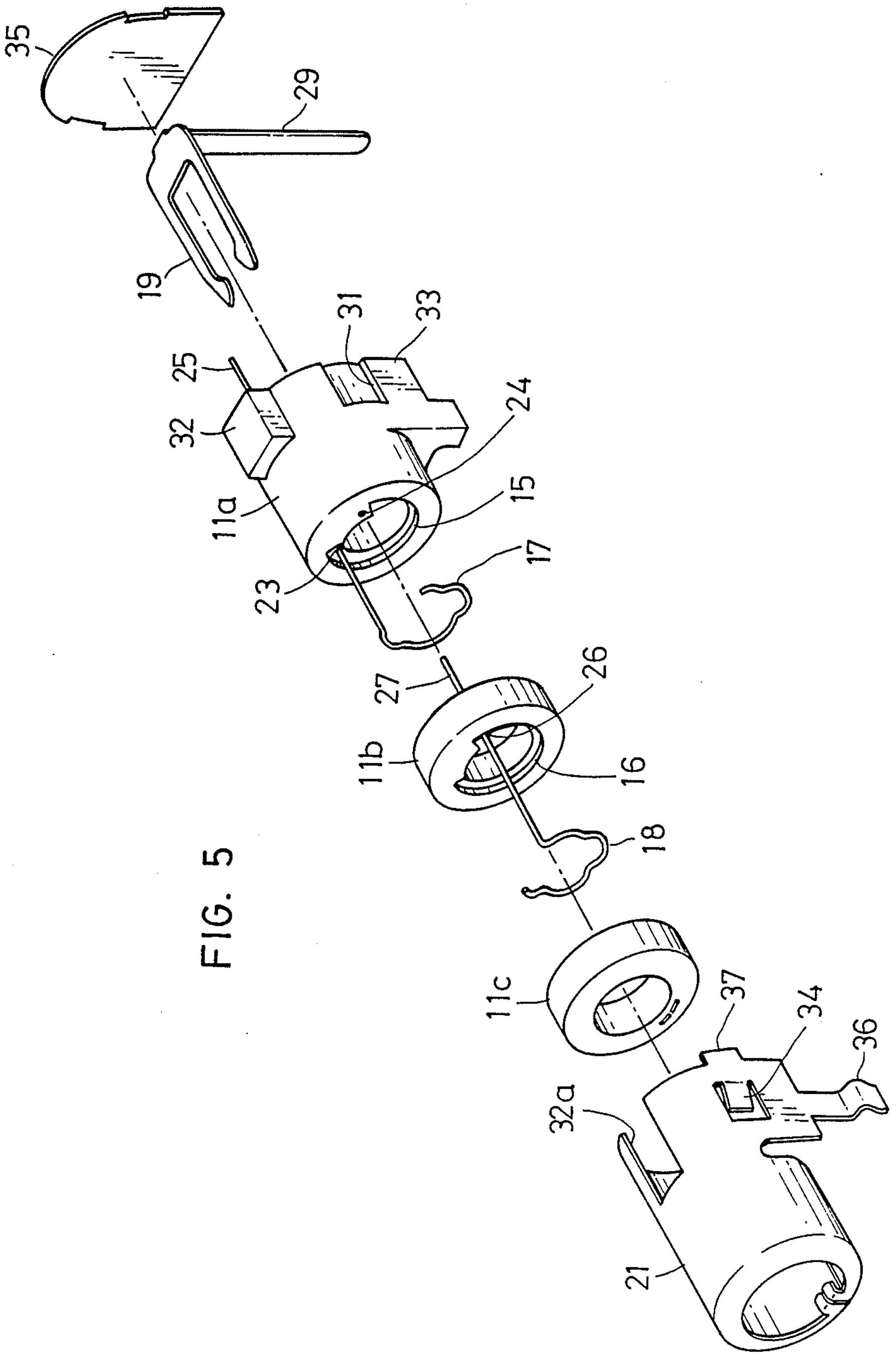
FIG. 5 is an exploded perspective view of the pin jack shown in FIG. 1.

Next, a description will be given of actual assembling of this pin jack. As depicted in FIGS. 3 and 5, the pin jack body 11 comprises a main body 11*a*, a washer 11*b* attached to the front thereof, and another washer 11*c* similarly attached to the front of washer 11*b*. The main body 11*a* defines therein the small-diametered hole portion 14 and a part of the large-diametered portion 13. The main body 11*a* has the first contact receiving groove 15 cut in its front and axially extending through holes 23 and 24 made in the side wall of the groove 15. A terminal 25 of the first contact 17 disposed in the groove 15 is passed through the through hole 23. The first contact 17 is a wire-like conductor bent into an open ring, which conforms to the interior surface of the large-diametered hole portion 13 but partly protrudes therefrom toward the center thereof, as shwon in FIG. 4. One end portion of the first contact 17 is bent substantially at right angles and passed through the through hole 23, and the projecting end portion is further bent down or in a desired direction to form a terminal 25 as depicted in FIG. 1.

The interior surface of the washers 11*b* and 11*c* jointly define the interior surface of the large-diametered portion 13. The washer 11*b* has the second contact receiving groove 16 in its front and an axially extending through hole 26 made in the side wall of the groove. The through holes 24 and 26 are axially aligned. The second contact 18 is substantially identical in construction with the first contact 17, and its terminal 27 is passed through the through holes 26 and 24 and bent in the same direction as the terminal 25, as shown in FIG. 1.

The small-diametered portion 14 has a pair of opposed guide grooves 28 cut in its inner surface and extending from its end face, as shown in FIG. 3. The third contact 19, having a forked configuration as depicted in FIG. 5, is inserted into the small-diametered hole portion 14 from behind, with its arms fitted in the pair of opposed guide grooves 28. The rear end portion of the third contact projects out of the small-diametered portion 14 at right angles to form a terminal 29.

After the first and third contacts 17 and 19 are mounted on the main body 11a as described above, the washer 11b with the second contact 18 mounted thereon is attached to the front of the main body 11a, the terminal 27 of the second contact 18 is passed through the through hole 24, and then the washer 11c is attached to the front of the washer 11b. After this, the metallic cover 21 is put on the pin jack body 11 from the front thereof. The main body 11a has a pair of opposed recesses 31 made in its outer peripheral surface, a protrusion 32 provided on the top, and a base portion 33 protrusively provided on the underside.

The metallic cover 21, formed by punching and press working of a metal sheet, has a cylindrical forward portion, and an inverted U-shaped rear portion. The inverted U-shaped rear portion has a notch 32a at the top for receiving the above-mentioned protrusion 32 and a pair of inwardly raised pawls 34 corresponding to the pair of recesses 31. When put on the pin jack body 11, the metallic cover 21 is fixed thereto with the notch 32a snugly receiving the protrusion 32, the downward opening of the inverted U-shaped portion resiliently gripping the base portion 33 and the pawls 34 engaged with the recesses 31. In this way, the main body 11a and the washers 11b and 11c are assembled into a unitary structure. An inverted U-shaped shield plate 35 is fastened to the back of the pin body 11 by means of lugs 37 on the metallic cover 21. The metallic cover 21 has a pair of terminals 36 extending therefrom form external connection.

Figure 6:
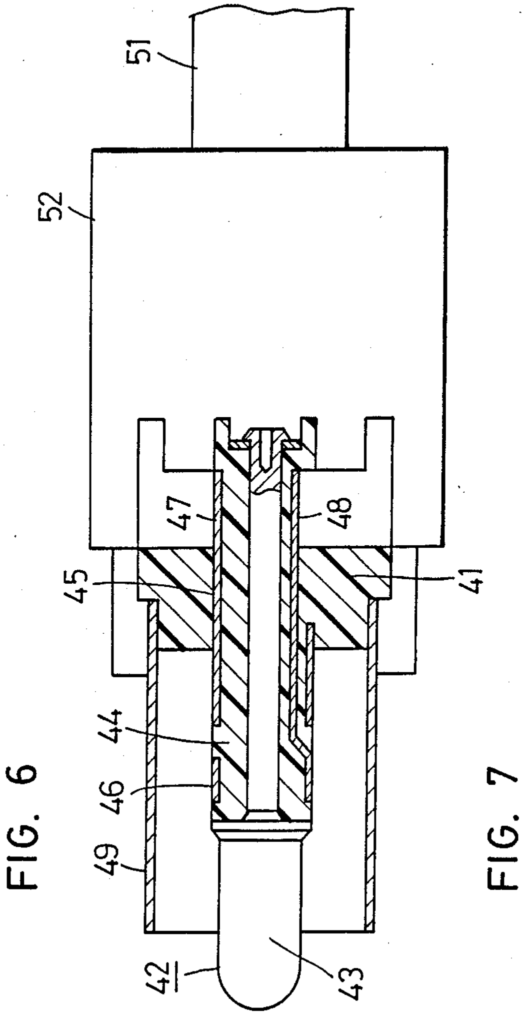
FIG. 6 is a sectional view showing an example of a pin plug for use with the pin jack of the present invention.

FIG. 6 illustrates an example of a pin plug for use with the pin jack described above. An insulating body 41 holds as pin contact 42 which is passed through its center hole. In this example the pin contact 42 has a center contact 43 at its front end which is inserted into the small-diametered portion 14 of the pin jack for engagement with the third contact 19. The diameter of the pin contact 42 behind the center contact 43 is reduced. An insulating tube 44 is put on the small-diametered portion of the pin contact 42 and ring-shaped contacts 45 and 46 are inserted into the insulating tube 44 and fixed thereto. The contacts 46 and 45 are provided for contact with the first and second contacts 17 and 18 of the pin jack, respectively. Terminals 47 and 48 of the ring-shaped contacts 45 and 46 are extended rearwardly thereof. A metallic cover 49 is fixed to the body 41 for receiving the metallic cover 21 of the pin jack when the pin plug is inserted thereinto. A transducer assembly 52 is interposed between a cable 51 and the body 41.

Figure 7:
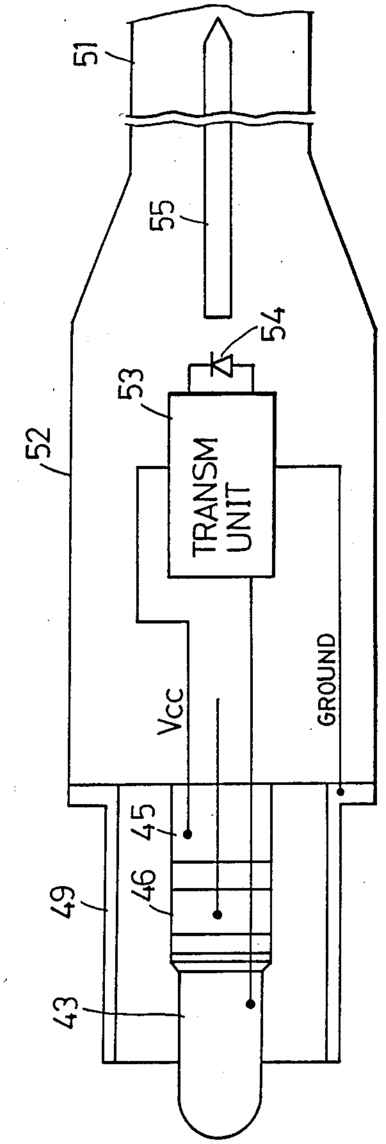
FIGS. 7 to 9 are diagrams showing examples of a transducer assembly 52 of the pin plug.
Figure 8:
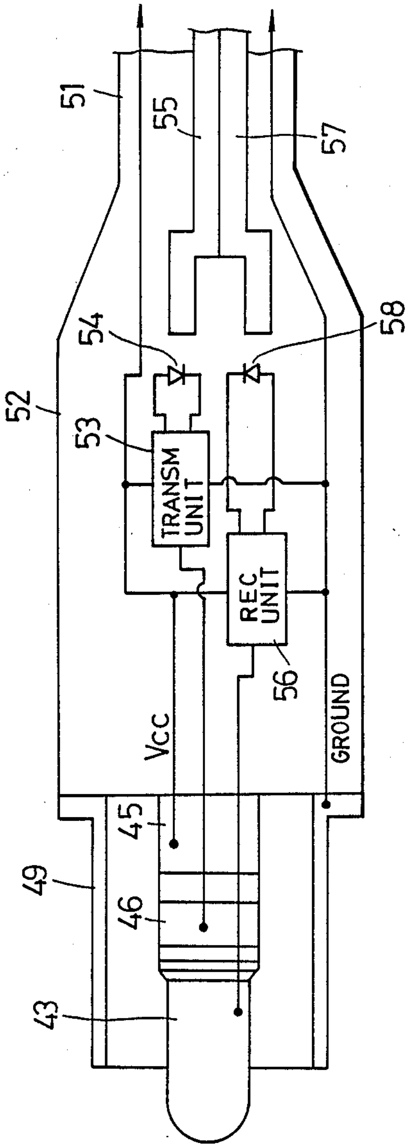
Figure 9:
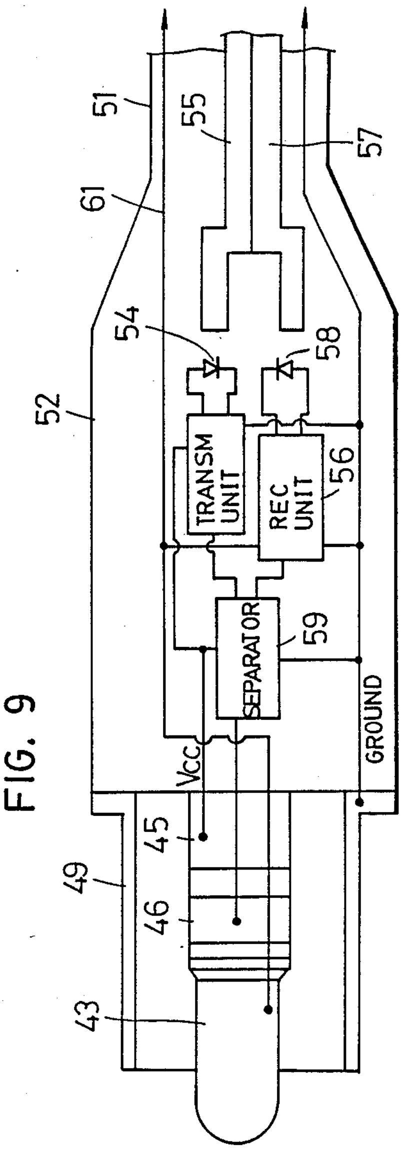

FIGS. 7 to 9 schematically show examples of the transducer assembly 52. In FIG. 7 the center contact 43 is connected to a signal input terminal of a transmitter unit 53 and the ring-shaped contact 45 and the cover 49 are connected to a power terminal and a grounding terminal of the transmitter unit 53, respectively. The output of the transmitter unit 53 is converted by a light emitting element 54 into an optical signal for input into an optical fiber 55 of the cable 51. It is also possible to replace the transmitter unit 53 with a receiver unit and to replace the light emitting element 54 with a photodetector.

In FIG. 8 the ring-shaped contact 46 is coupled to the signal input terminal of the transmitter unit 53, the center contact 43 is connected to the output terminal of a receiver unit 56, and light from an optical fiber 57 of the optical cable 51 is applied to a photodetector 58, the output of which is supplied to the receiver unit 56. This example is identical with that shown in FIG. 7 except for the above.

In FIG. 9 the input terminal of the transmitter unit 53 and the output terminal of the receiver unit 56 are both connected via a separator circuit 59 to the ring-shaped contact 46. The center contact 43 is coupled to an electric wire 61 for the transmission or reception of an analog signal.

Figure 10:
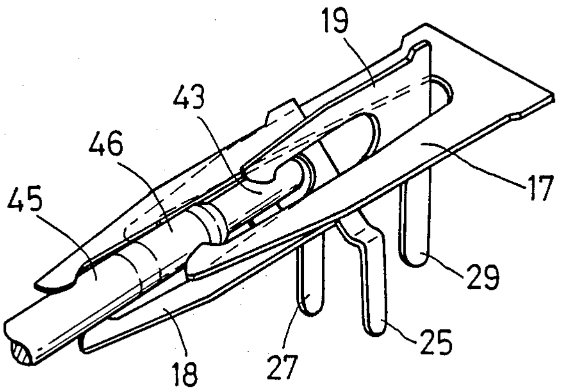
FIG. 10 is a perspective view showing modifications of the first to third contacts.
Figure 11:
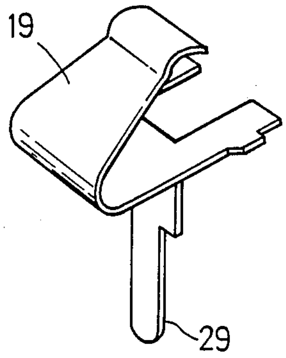
FIG. 11 is a perspective view of another modifications of the third contact.

All the contacts of the pin jack may also be replaced with forked contacts, in which case they are disposed at different angle positions, as depicted in FIG. 10. Furthermore, the third contact 19 may be formed by bending an elastic plate into a desired shape, as shown in FIG. 11.

As described above, the pin jack of the present invention can be used with the pin plug having the center contact 43 and the ring-shaped contacts 45 and 46, which are engaged with the third, second and first contacts 19, 18 and 17 of the pin jack, respectively. The pin jack can be utilized as well with a pin plug having only a center contact, such as a conventional PCA pin plug, and the center contact is received by the third contact 19. In this instance, since the center contact is guided into and supported in the small-diametered hole portion 14 without making contact with the first and second contacts 17 and 18, there is no possibility of malfunctions. Moreover, an optical connector can be obtained by the combined use of the pin jack of the present invention and such a pin plug as shown in FIGS. 7 to 9. In this case, since the transducer is provided in the pin plug, the number of transducers which are needed for various equipment can be reduced as compared with the case where the transducer is provided in the pin jack.

It will be apparent that many modifications and variations can be effected without departing from the scope of the novel concepts of the present invention.

What is claimed is:

1. A pin jack adapted to receive any of a plurality of different types of plugs, comprising:

a pin jack body fabricated of an insulating material and having a cylindrical portion, an elongated contact receiving hole extending through said cylindrical portion along the axis of said cylindrical portion for receiving a pin contact of a mating pin plug, said elongated contact receiving hole having a large-diametered cylindrical forward portion of comparatively large inner diameter and a small-diametered cylindrical rear portion of smaller inner diameter;

first and second contacts disposed adjacent the interior surface of said large-diametered forward portion at different positions that are axially spaced from one another along said elongated contact receiving hole, at least a part of each of said first and second contacts protruding into said contact receiving hole from the interior surface of said large-diametered portion of said hole;

a third contact held in said pin jack body and extending along the small diametered portion of said hole in the axial direction of said hole; and a metallic cover on the pin jack body, said metallic cover being disposed around the exterior of said cylindrical portion of said pin jack body.

2. The pin jack of claim 1, wherein the interior surface of said large-diametered portion of said hole has first and second contact recieving grooves in which said first and second contacts are respectively located.

3. The pin jack of claim 2 wherein said large-diametered portion of said elongated hole is defined by said pin jack body and by first and second annular washers that are disposed in coaxial relation to one another adjacent the forward end of said cylindrical portion of said pin jack body in the axial direction of said pin jack body, said first contact receiving groove being located adjacent the boundary between the forward end of said cylindrical portion of said pin jack body and the first washer, and said second contact receiving groove being located adjacent the boundary between said first and second washers.

4. The pin jack of claim 3, wherein the first and second contacts are substantially ring-shaped.

5. The pin jack of claim 3 wherein said first contact has an end portion which passes through said pin jack body in its axial direction and then extends at right angles to said axial direction along the rear end face of said pin jack body to form a first terminal, and said second contact has an end portion which passes through said first washer and through said pin jack body in the axial direction thereof and then extends at right angles to said axial direction along the rear end face of said pin jack body to form a second terminal.

6. The pin jack of claim 1 wherein said metallic cover has an inverted U-shaped rear portion which receives therein the rear portion of the pin jack body.

7. A pin connector comprising:

a pin jack which includes a pin jack body fabricated of an insulating material and having an elongated hole therein for receiving a mating pin contact, said elongated hole having a comparatively large-diametered forward portion and a smaller-diametered rear portion, first and second contacts held in the interior surface of the large-diametered portion of said hole at different positions in the axial direction of the contact receiving hole, at least one portion of each of the frist and second contacts protruding from the interior surface of the large-diametered portion of said hole radially thereof, a third contact held in the pin jack body and extending in the smaller-diametered rear portion of said hole in the axial direction of said pin jack body, and a metallic cover on the pin jack body; and a pin plug which includes an insulating tube of an outer diameter small enough to be received in the large-diametered portion of the elongated hole in said pin jack, a plug body of an insulating material which holds the insulating tube along the axis thereof, a pin contact having a front end portion whose diameter is small enough to be received in the smaller-diametered portion of the elongated hole in said pin jack and a rear portion which passes through and is held by the insulating tube, first and second metallic contacts disposed on the outer peripheral surface of the insulating tube at different positions in its axial direction, and a cylindrical metallic portion extending forwardly of the plug body coaxially with the pin contact for receiving the forward portion of the metallic cover of the pin jack.

8. The pin connector of claim 7 wherein a rear end portion of the plug body contains therein at least one optical transducer and at least one of a transmitter unit and a receiver unit connected thereto and an optical cable having an optical fiber an end face of which is disposed opposite the optical transducer, said optical cable extending outwardly of the rear portion of the plug body.

9. A pin jack comprising:

a pin jack body fabricated of an insulating material and having an elongated contact receiving hole therein for receiving a pin contact of a mating pin plug, the contact receiving hole having a large-diametered forward portion of comparatively large inner diameter and a small-diametered rear portion of smaller inner diameter;

the interior surface of said large-diametered portion of said hole having first and second contact receiving grooves therein, said large-diametered portion of said hole being defined by said pin jack body and by first and second washers that are disposed adjacent to one another at the forward end of said pin jack body in the axial direction of the pin jack body, said first contact receiving groove being provided at the boundary between the pin jack body and the first washer, and said second contact receiving groove being provided at the boundary between the first and second washers;

first and second contacts held in said contact receiving grooves adjacent the interior surface of said large-diametered forward portion at different positions in the axial direction of said elongated contact receiving hole, at least a part of each of said first and second contacts protruding from the interior surface of said large-diametered portion of said hole radially thereof;

a third contact held in said pin jack body and extending in the small-diametered portion of said hole in the axial direction of said hole; and a metallic cover on the pin jack body.

10. The pin jack of claim 9 wherein said first and second contacts are substantially ring-shaped members made of an elastic material.

11. The pin jack of claim 9 wherein one end portion of said first contact passes through a first through hole made in the pin jack body in its axial direction and then extends at right angles to said axial direction along the rear end face of said pin jack body to form a first terminal, and one end portion of said second contact passes through a second through hole extending through said first washer and the pin jack body in the axial direction thereof and then extends at right angles to said axial direction along the rear end face of said pin jack body to form a second terminal.

12. The pin jack of one of claims 9, 10 or 11 wherein at least one radially protruding portion of each of said first and second contacts lies between the interior surfaces of the small-diametered and large-diametered portions of said hole in a radial direction.

13. The pin jack of claim 9 wherein said metallic cover has a substantially cylindrical forward portion which receives therein said pin jack body and said first and second washers.

14. The pin jack of claim 13 wherein said metallic cover has an inverted U-shaped rear portion which receives the rear portion of said pin jack body.

* * * * *